United States Patent [19]
Bruhns et al.

[11] Patent Number: 5,646,569
[45] Date of Patent: Jul. 8, 1997

[54] METHOD AND APPARATUS FOR AC COUPLING

[75] Inventors: Thomas V. Bruhns, Everett; Donald R. Hiller, Lake Stevens; Jan R. Hofland; James W. Waite, Jr., both of Everett, all of Wash.

[73] Assignee: Hewlett-Packard Company, Palo Alto, Calif.

[21] Appl. No.: 521,161

[22] Filed: Aug. 30, 1995

[51] Int. Cl.$^6$ .................................................. H03K 17/16
[52] U.S. Cl. .......................... 327/307; 327/352; 327/361
[58] Field of Search .................................... 327/307, 352, 327/361

[56] References Cited

U.S. PATENT DOCUMENTS

| 3,800,236 | 3/1974 | Riethmuller et al. | 327/307 |
|---|---|---|---|
| 3,953,805 | 4/1976 | Couvillon | 327/307 |
| 4,140,925 | 2/1979 | Meyer | 327/307 |
| 4,229,703 | 10/1980 | Bustin | 327/307 |
| 4,377,759 | 3/1983 | Ohhata et al. | 327/307 |
| 4,430,622 | 2/1984 | Simoes | 327/307 |
| 5,241,702 | 8/1993 | Dent | 455/278.1 |
| 5,389,839 | 2/1995 | Heck | 327/307 |
| 5,471,244 | 11/1995 | Wolfe | 348/257 |
| 5,477,183 | 12/1995 | Hayes | 327/307 |

FOREIGN PATENT DOCUMENTS

| 4201194 | 7/1993 | Germany | 327/307 |
|---|---|---|---|
| 63-128812 | 6/1988 | Japan | 327/307 |
| 63-241468 | 10/1988 | Japan | 327/307 |
| 2085599 | 4/1982 | United Kingdom | 327/307 |

OTHER PUBLICATIONS

*Burr-Brown IC Data Book—Linear Products*, 1995, pp. 4.31, 4.63, 4.73, 4.174, 4.187.

Primary Examiner—Timothy P. Callahan
Assistant Examiner—T. Lam

[57] ABSTRACT

AC coupling is effected by a feedback circuit that detects a DC component in the coupled signal, and adjusts a DC subtraction signal accordingly. In one embodiment, a digital signal processor (DSP) analyzes the coupled signal for a remaining DC component, and controls the subtraction signal. Use of a DSP allows dynamic control of parameters including AC cutoff frequency, gain, and transfer function. Another embodiment provides accurately phase matched AC coupling across two or more signal channels.

17 Claims, 2 Drawing Sheets

METHOD AND APPARATUS FOR AC COUPLING

FIELD OF INVENTION

The present invention relates to AC coupling circuits.

BACKGROUND AND SUMMARY OF THE INVENTION

AC coupling is typically used in the input circuitry of test and measurement equipment to allow measurement of AC signals riding on top of DC signals. The AC coupling is usually located before any amplification stages so that amplifier gain switching does not disturb the quiescent state of the AC coupling capacitor. If gain were switched ahead of this capacitor, the DC value applied to the capacitor would also change and the circuit would require a relatively long period of time to settle. Additionally, applying the AC coupling early in the signal path allows removal of DC signals that could overload subsequent analog or digital stages.

A variety of AC coupling techniques are known. The simplest is to use a series capacitor between the input signal and the first amplification stage. Associated with the capacitor, however, is stray inductance, resistance, and non-linearities due, e.g., to wire leads, and dielectric resistivity and absorption. In some applications, these stray effects can degrade circuit performance, such as by introducing RC time constants which limit the circuit's bandwidth or by introducing distortion components.

A second AC coupling technique relies on a DC buckout circuit. In a DC buckout circuit, a DC voltage is subtracted from the input signal, leaving just the AC component. Buckout AC coupling circuits, however, suffer from problems including drift of the subtraction voltage with temperature and other phenomena, and drift of the DC component of the input signal, both of which result in the coupled AC signal still having a DC component.

Some applications require that the circuit dynamically switch between AC and DC coupling while the circuit is in operation. Neither the coupling capacitor nor the DC buckout circuit can accommodate such switching without additional circuit components. The switching must be done at the AC coupling circuitry, prior to the amplification stage at the front end of the input circuitry because of the aforementioned gain switching problems. Input voltages at this location, however, can exceed the operational limits of active (e.g., semiconductor) switches, requiring relays to be used. But relays are relatively large, expensive and are prone to reliability problems. They can also exacerbate the problems of stray inductance and resistance noted earlier.

It is also difficult to maintain a constant input impedance in circuits capable of dynamically switching between AC and DC coupling. As those skilled in the art will recognize, a constant input impedance is important in many test/ measurement applications.

Moreover, it is difficult to achieve sufficient initial accuracy and stability over time and environmental conditions of the AC coupling cutoff frequency, which is related to matching the phase response over multiple channels.

The present invention overcomes these and other limitations of the prior art. Some embodiments allow for dynamic switching between AC and DC coupling without the use of relays, while maintaining a constant input impedance. Drift of circuit parameters due to temperature, aging, or other phenomena have a reduced effect on performance in most embodiments.

In the preferred embodiment, a summing device combines an input signal with a subtraction signal to yield a DC-free output signal. Processing circuitry detects any DC component on the output signal and dynamically creates a corresponding subtraction signal to cancel the same.

In addition to overcoming the above-noted deficiencies, the preferred embodiment provides a number of further advantages as well. For example, the AC cutoff frequency can be dynamically changed, and the circuit's transfer function can be dynamically converted between single- and multiple-pole to change the AC passband shape.

The summing circuit can take a number of forms, including those based on resistive combiners and controllable current sources.

In a second embodiment, the circuit can control AC coupling filter response very accurately so that, for example, multiple channels remain phase matched at frequencies in the vicinity of the AC coupling cutoff frequency.

The foregoing and additional features and advantages of the present invention will be more readily apparent from the following detailed description, which proceeds with reference to the accompanying drawings.

DETAILED DESCRIPTION OF A PREFERRED EMBODIMENTS

To provide a comprehensive disclosure without unduly lengthening this specification, applicants incorporate by reference the disclosures of U.S. Pat. Nos. 5,168,459 and 5,189,418.

Figure 1:
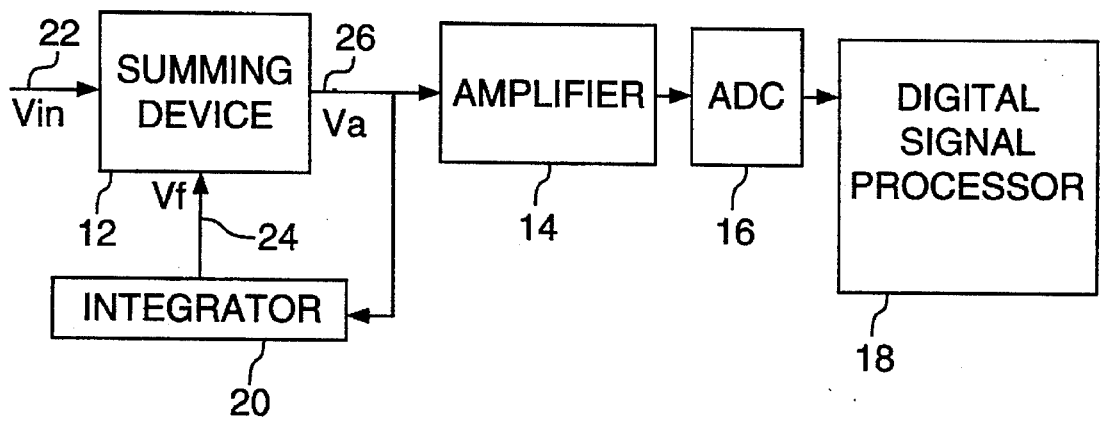
FIG. 1 is block diagram of a known AC coupling circuit.

Referring to FIG. 1, a known embodiment 10 includes a summing device 12, an amplifier 14, an analog-to-digital converter (ADC) 16, a digital signal processor (DSP) 18, and an integrator 20.

Summing device 12 has two input ports 22, 24, and an output port 26. First input port 22 is driven with an input signal $V_{in}$ that is to be AC coupled. Second input port 24 is driven with a subtraction signal $V_f$ provided from the output of integrator 20. Summing device 12 operates to subtract the signal on second input 24 from that on first input 22, yielding on output terminal 26 an output signal $V_a$ that is substantially free of DC component.

A typical implementation of integrator 20 would include a signal inversion, and a corresponding implementation of summing device 12 would then add the signal at second input port 24, rather than subtracting it, to maintain the same overall circuit function of subtraction of the integration of signal $V_a$.

It will be recognized that integrator 20 responds primarily to a DC component of output signal $V_a$; AC components have a zero mean and so have a minimum influence on the integrator output signal $V_f$.

In the AC coupled mode (i.e., $V_f \neq 0$), the gain from $V_{in}$ to $V_a$ can be expressed in the Laplace transform domain as:

$$V_a/V_{in} = \frac{\frac{s}{w_c}}{1 + \frac{s}{w_c}} \quad (1)$$

where $\omega_c$ = AC coupling cutoff frequency (in radians per second). $\omega_c$ equals $\omega_i$, where $\omega_i$ is the integrator unity gain frequency (in radians per second).

Equation (1) can be seen to represent a single pole AC filter response: a zero at DC and a pole at the AC passband edge ($\omega_c$ radians per second). At frequencies well above $\omega_c$, the gain is the same as the DC coupled case (i.e., when $V_f = 0$).

Figure 2:
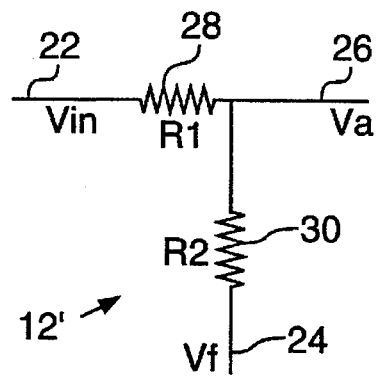
FIG. 2 is a known summing device used in the coupling circuit of FIG. 1.

FIG. 2 shows a known resistive summer circuit 12' that can be used as the summing device 12 in FIG. 1. Circuit 12' employs first and second resistors 28, 30 to couple signals from the input port 22 and subtraction signal port 24, respectively, to the output 26. Its form will be familiar as that of a resistive attenuator.

Terming resistor 28 $R_1$ and resistor 30 $R_2$, it will be recognized that:

$$V_a = V_{in} \cdot K_i + V_f \cdot K_f \quad (2)$$

$$\text{where} \quad K_i = \frac{R_2}{R_1 + R_2} \quad \text{and} \quad K_f = \frac{R_1}{R_1 + R_2}$$

$V_a$ is thus a weighted sum of $V_{in}$ and $V_f$. The input gain, from $V_{in}$ to $V_a$, is still attenuated by $K_i = R_2/(R_1+R_2)$, as it would be if $V_f$ was grounded. The gain of the DC feedback signal, $V_f$ to $V_a$, is now attenuated by $K_f = R_2/(R_1+R_2)$, The AC coupled gain, A, is thus:

$$A = K_i \cdot \frac{\frac{s}{w_c}}{1 + \frac{s}{w_c}}$$

where $\omega_c = K_f \omega_i$. (3)

The integrator gain is now multiplied by the attenuator in series with its output, $K_f$. This causes the AC coupling cutoff frequency to be reduced by $K_f$.

While simple, the FIG. 1 circuit has various drawbacks that are unsuitable for certain applications.

Figure 3:
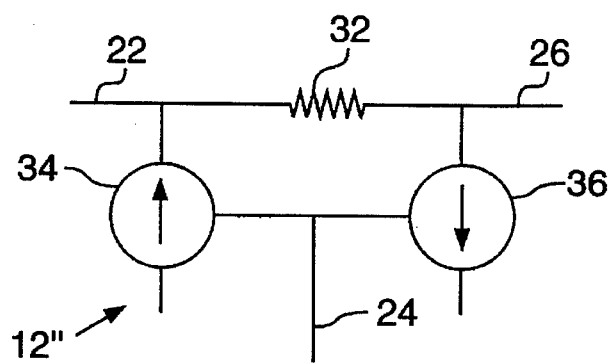
FIG. 3 is a summing device according to an embodiment of the invention.

FIG. 3 shows an embodiment of a summing device according to the invention. Circuit 12" can be used as the summing device 12 in FIG. 1. Circuit 12" includes first and second matched current sources 34, 36, which cause a current to flow through a resistor 32. (The current sources are coupled to a power source, not shown.) Each of the current sources is controlled by a control signal (i.e., the subtraction signal $V_f$) applied to terminal 24. By controlling the current through resistor 32, the voltage drop there across can also be controlled. The feedback circuit controls these current sources to produce a voltage drop across resistor 32 that precisely matches the DC component of the input signal applied to terminal 22, thereby removing this component from the input signal.

It will be recognized that the value of resistor 32 is not critical, but the size of the current sources 34, 36 will vary accordingly. In the illustrated embodiment, resistor 32 has a value of 20K ohms and the current sources present a high impedance to terminals 22 and 26. Thus, the combination of resistor 32 and parallel current sources 34, 36 represent a high input impedance at input 22, generally in the megaohm range.

Using bipolar current sources, the circuit of FIG. 3 can remove a DC component of either polarity, and can similarly remove AC components.

Figure 4:
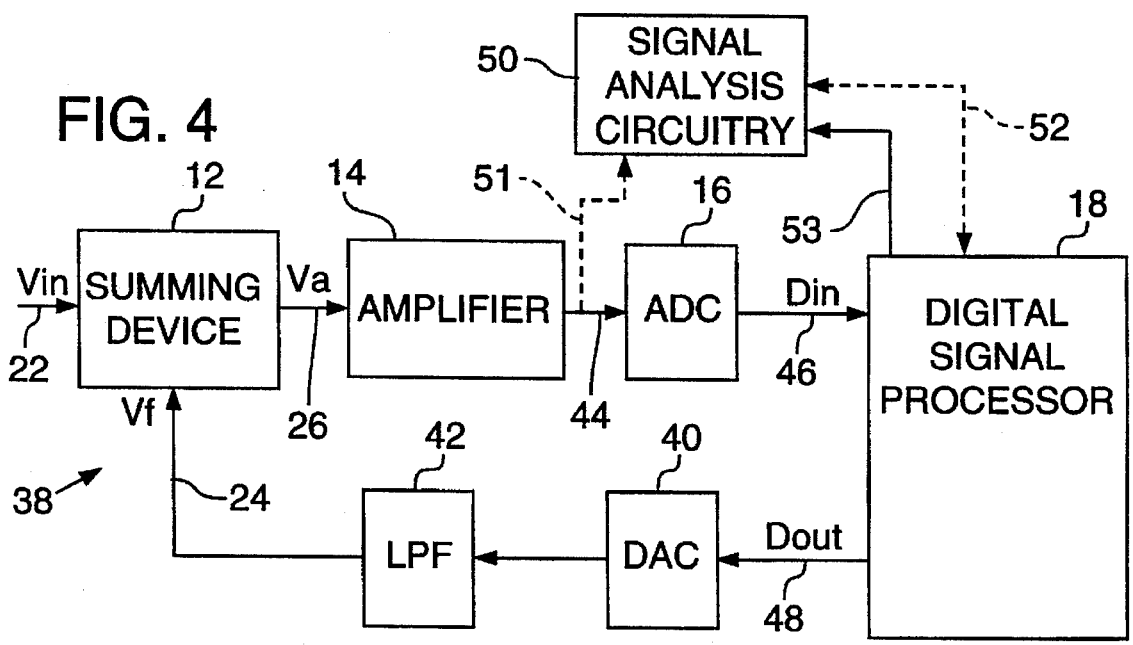
FIG. 4 is a block diagram of a digital signal processor-based AC coupling circuit.

The circuit 38 of FIG. 4 includes summing device 12, amplifier 14, ADC 16, DSP 18, a digital to analog converter (DAC) 40 and a low pass filter (LPF) 42 in lieu of the integrator 20. The summing device 12 can be the form shown in FIG. 2 or FIG. 3, but the FIG. 2 embodiment is preferred.

Amplifier 14 is coupled to output 26 of summing device 12 and amplifies the AC and any residual DC signal provided thereby. This amplified signal is provided to an input 44 of ADC 16, which samples the signal and converts the samples into digital form. The resulting digital data is provided to input 46 of DSP 18.

DSP 18 analyzes the amplified, sampled signal to determine the magnitude and sign of any remaining DC component. Such a DC component may result, for example, from a change in the DC component of the input signal, or from an inaccuracy in the subtraction signal provided by DSP 18 to the summing device 12. The DSP produces, on output 48, a digital control signal corresponding to any such detected DC component.

The control signal on output 48 is converted into analog form by DAC 40, and is applied to the summing device 12 through the low pass filter 42. There it serves to cancel the DC component on the input signal. (The low pass filter 42 attenuates high frequency noise that might otherwise be coupled into the signal path through summing device 12. Filter 42 desirably has a cutoff frequency slightly higher than the AC coupling cutoff frequency.)

The illustrated DSP 18 is a Motorola 56002, but other devices can alternatively be used. For example, it is possible to accomplish the same effect with any hardware which can perform the required scaling, delay and additional tasks as are performed in the DSP. Specifically, such hardware can be digital logic, programmable array logic with shift registers, gate arrays, or field programmable gate arrays, just to name a few. The DSP has the advantages of programmability, flexibility, and the ability to perform other signal processing tasks concurrently with the AC coupling tasks, and do so economically.

As suggested, an exemplary application of the AC coupling circuit 38 is in the front end of a test/measurement instrument, such as a spectrum analyzer, network analyzer, oscilloscope, etc. Such equipment employs signal analysis and measurement control circuitry 50 which may be driven by either the AC-coupled analog input signal (shown as dashed line 51 in FIG. 4), but typically its digital counterpart (shown as dashed line 53 FIG. 4). The signal analysis circuitry typically includes a microprocessor and/or DSP programmed to perform a variety of signal analysis routines, and may include a display device on which the results of these analyses are presented to the user. In the illustrated embodiment, the control circuitry 50 controls operation of the DSP 18 through a control bus 52.

In FIG. 4, $D_{in}$ represents the digital signal applied to input 46 of DSP 18, and $D_{out}$ represents the corresponding output digital control signal. $D_{out}$ controls $V_f$ through DAC 40 and LPF 42. DSP 18 controls the feedback (subtraction) signal $V_f$ and sets the overall transfer function, as discussed below.

To implement first order AC coupling (e.g., as was used in FIG. 1), DSP 18 implements an integrator (accumulator) function. That is:

$$D_{out}[n] = K_1 \cdot D_{in}[n] + D_{out}[n-1] \quad (4)$$

where n corresponds to the current sample and n−1 corresponds to the previous sample. The transfer function, in the Z domain, of this accumulator is:

$$\frac{D_{out}}{D_{in}} = \frac{K_1}{1 - Z^{-1}} \qquad (5)$$

where $K_1$ is a constant. For frequencies much less than the sample rate, this pole at Z=1 is almost identical to an integrator in continuous time. This corresponds to the substitution Z=1+sT (T is the sample interval), which is quite accurate for frequencies much lower than the sample rate 1/T. (This is a Taylor series approximation, truncated to the first two terms, for the exact relationship, $Z=e^{sT}$).

Constant $K_1$ is chosen to implement the transfer function A discussed above in connection with FIG. 1. In the FIG. 4 embodiment, the integrator consists of all the signal processing from $V_a$, through amplifier 14, ADC 16, DSP 18, DAC 40, and LFP 42, to $V_f$. At low frequencies, the accumulator in the DSP portion of the signal processing loop almost completely dominates the transfer function except for the DC gain through the rest of the path. This allows placement of the pole in the closed loop transfer function (the AC coupling cutoff frequency) at the desired frequency. As the gain of amplifier 14 is changed, $K_1$ can be changed synchronously to keep the overall gain from $V_a$ to $V_f$ constant, with no additional transient in the AC coupling.

Being able to change $K_1$ easily has the additional advantage of allowing the AC coupling cutoff frequency to be changed, again without an additional low frequency transient.

One further improvement is to use the well known linear phase integrator implementation:

$$D_{out}[n] = \frac{K_1}{2} \cdot (D_{in}[n] + D_{in}[n-1]) + D_{out}[n-1] \qquad (6)$$

More general transfer functions can be synthesized by appropriate programming of DSP 18. Taking the transfer function from amplifier 14 input, $V_a$, through the ADC, DSP, DAC, and LPF to $V_f$ as $H_f(s)$, the gain from $V_{in}$ to $V_a$ is:

$$A = \frac{1}{1 - H_f(s)} \qquad (7)$$

For instance, when $H_f(s)$ is a double integrator with a single zero:

$$H_f(s) = -\frac{1 + \frac{s}{\omega_d}}{\left(\frac{s}{\omega_i}\right)^2} \qquad (8)$$

the overall transfer becomes:

$$A = \frac{\left(\frac{s}{\omega_c}\right)^2}{\left(\frac{s}{\omega_c}\right)^2 + \left(\frac{s}{\omega_d}\right) + 1} \qquad (9)$$

where $\omega_c = \omega_i$ =AC coupling cutoff frequency in radians per second.

This is second order AC coupling, which yields nominally twice the decibel attenuation at frequencies below the cutoff frequency as does first order coupling. In addition, second order coupling yields passband response, that is, response at frequencies above the cutoff frequency, which is more constant with frequency than does first order coupling. ($\omega_d$ is a parameter that controls the details of the response at frequencies near the cutoff frequency; considered as a time domain response, $\omega_d$ controls system damping.)

Clearly, higher order AC coupling can be implemented as well as other additions to the overall transfer functions.

Implementation of $H_f(s)$ is primarily in DSP 18 so that it can be more accurately implemented, using Z-transform analysis and synthesis techniques. To the first order, the substitution of Z=1+sT is reasonably accurate at the low frequencies involved. More exact Z to S (Laplace) domain transformation approximations are available should they be necessary, as will be readily apparent to one skilled in the art.

Even if the DSP is being used for other tasks, the computational loading on DSP 18 to implement the first order (accumulator) or second order $H_f(s)$ is fairly small compared to the other processing typically being done in the DSP, so the impact is minimal.

As in the FIG. 1 embodiment, the input attenuator of FIG. 2 can be used to implement summing device 12. In this case, the overall gain, A, is multiplied by $K_i$ and the $H_f(s)$ gain is multiplied by $K_f$:

$$A = \frac{K_i}{1 - K_f \cdot H_f(s)} \qquad (10)$$

And for $$H_f(s) = -\frac{1 + \frac{s}{\omega_d}}{\left(\frac{s}{\omega_i}\right)^2}$$

$$A = \frac{K_i \cdot \left(\frac{s}{\omega_c}\right)^2}{\left(\frac{s}{\omega_c}\right)^2 + \frac{s}{\omega_d} + 1} \qquad (11)$$

where $\omega_c = \sqrt{K_f} \cdot \omega_i$

Although gains are shown at specific points, it will be recognized that the gain may be distributed among the components of the forward signal path within the overall AC coupling loop and similarly gain may be distributed among the components of the feedback portion of the overall loop.

Some applications have a use for a separate output of the "DC" component of the input signal. The value $D_{out}$ provided to DAC 40 generally represents this value and can be used directly or averaged to produce this value.

In the above-described arrangement, a possible accuracy concern is that $H_f(s)$ includes all of the input circuitry as well as DAC 40 and LPF 42. The gain through this loop has a significant effect on the value of $\omega_c$. This loop gain can be calibrated with the input disconnected from other sources simply by driving DAC 40 and measuring the response at the ADC 16 output.

On the other hand, the "DC" output cannot be calibrated in such a way. It is limited directly by the gain error of DAC 40 and of LPF 42. However, if amplifier 14 and ADC 16 have more controlled gain, it can be inferred from the loop gain calibration and have the same error as the input gain accuracy.

A calibration alternative when the input cannot be disconnected is to add a pseudo random binary sequence (or any other guaranteed orthogonal signal) to the DAC output and then detect its amplitude precisely in the DSP 18. Techniques such as found in U.S. Pat. Nos. 5,168,459 or 5,189,418 can be used to extend this calibration to operate without the calibration signal being present in the DSP output and even correct for the LPF filter shape, at the expense of a greatly increased DSP processing load.

The input attenuator summing device of FIG. 2 does not lend itself well to the foregoing alternative without some modification. The impedance in the $R_1$ leg, which includes the impedance of the Vin connection, if any, would have to be controlled. Changing $R_1$ to be two resistors in series with a grounding switch in the middle would be one limited possibility.

As in the FIG. 1 embodiment, noise and distortion present at $V_f$ can be a problem. The dynamic range required of DAC 40 and LPF 42 is as large as the dynamic range required at $V_i$, which is greater than the dynamic range of ADC 16, generally by the amount of gain that is switched in and out of amplifier 14. Requiring that DAC 40 have significantly higher resolution and lower noise than other parts of the circuit such as ADC 16 could easily cause DAC 40 to dominate the cost of the circuit. However, the bandwidth required in the feedback path is very limited, which explains why LPF 42 is included in the FIG. 4 embodiment. Higher frequencies can be attenuated, reducing the noise and distortion at $V_f$.

At one extreme, LPF 42 can be an integrator or a low pass filter with a cutoff frequency well below $\omega_c$. With low enough integrator gain or low enough cutoff frequency, noise and distortion would be sufficiently filtered out. However, the low gain near $\omega_c$ would limit the power bandwidth of the AC coupling. At frequencies near $\omega_c$ and even lower, a full scale DAC signal would not be large enough to result in a $V_f$ that could follow and subtract larger signals.

Also, if a "DC" output is desired, it is lost in LPF 42 if it is an integrator. A better implementation in this case is a low pass filter, with a cutoff near $\omega_c$ (or the highest $\omega_c$ that will be selected if several cutoff frequencies are to be available). If LPF 42 plays an important role in the response, then it becomes important that the DSP can measure the response around the feedback loop, including LPF 42, so that coefficients in the algorithm used in the DSP to calculate the feedback can be adjusted to maintain the desired overall AC coupling characteristic.

With LPF 42, noise is introduced mainly in the $\omega_c$ region. Below $\omega_c$, the feedback cancels the noise, but it will be seen at the "DC" output unless filtered more. Above $\omega_c$, LPF 42 filters it out.

Distortion harmonics are canceled and filtered in the same way, but some applications may be more sensitive to distortion. In this case, out of band dither can be used to give better small scale linearity to DAC 40.

This out of band dither would be band limited random or pseudo random noise at frequencies above the cutoff frequency of LPF 42, digitally added to the signal going to DAC 40. LPF 42 filters out this noise energy before it reaches amplifier 14, but it will still have the linearizing effect of dither on the DAC output.

This same idea also has the effect of extending the resolution of DAC 40 below the quantization level. If only resolution enhancement is needed or even if the DAC quantization noise is too great, noise spectral shaping can be used to modulate the quantization noise out of band and so extend the DAC resolution at the same time. In noise spectral shaping, digital filtering is used to decide whether to round up or down to the nearest DAC quantization level in such a way that the quantization errors have a desired spectral shape, again out of band.

An important contribution of the circuit of FIG. 4 is that removal of the DC component is complete to within the accuracy of numeric representation in the algorithms in the DSP. This is independent of DC offsets anywhere in the signal path. This should be distinguished from the implementation of FIG. 1 wherein any DC offset at the input of integrator 20 directly contributes to incomplete removal of DC from the signal.

The FIG. 4 design also lends itself to subtracting differential DC values from differential input circuits. In this case, LPF 42 output drives an attenuator for one of the two inputs. The attenuator for the other input is driven by the same LPF output, but passed through a precision gain of −1 amplifier, to give it the correct polarity. Additionally, the design can have circuits on each of the differential input lines that can introduce offsets, but have the net effect of these controlled by two inputs. One of the inputs is designed to null differential mode DC and the other input is designed to null common mode DC signals.

Figure 5:
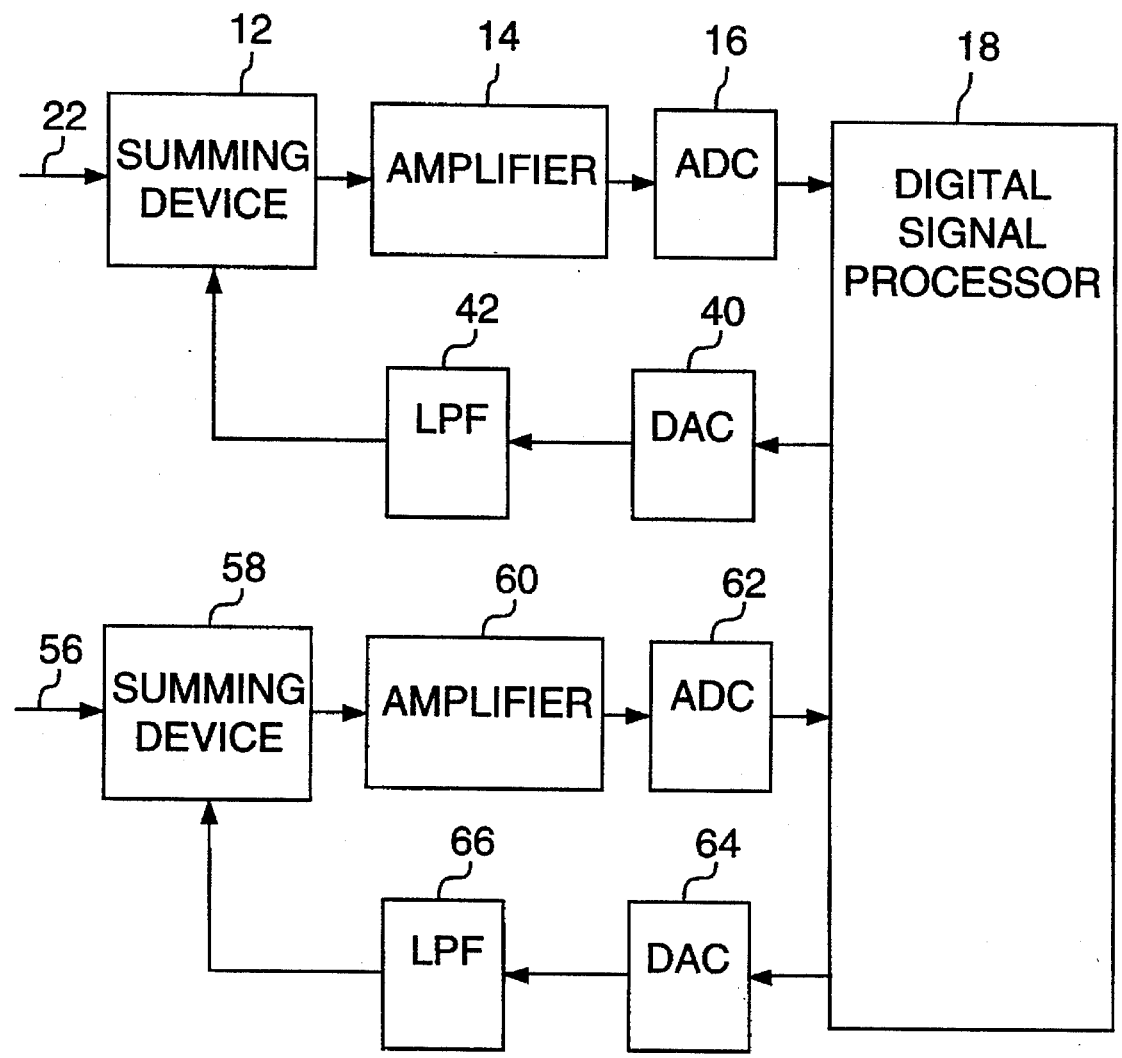
FIG. 5 is a block diagram showing a modification to the FIG. 4 embodiment that allows phase matching of several channels independently by accurately matching the phase response of a desired transfer function.

FIG. 5 shows the FIG. 4 circuit applied to phase match two incoming signals. The importance of phase matching is that the DSP provides a signal with a phase characteristic that is accurately known and that can easily be made the same for a multitude of channels. Thus, if all the channels share the same clock, they will behave the same to within the relatively minor contributions of differences in the analog components among the channels. Calibration schemes, such as outlined above can be used as desired to compensate for even these differences.

A first input signal is received by input 22 of summing device 12, passes through amplifier 14, ADC 16, DSP 18, DAC 40 and LPF 42, as already explained in the FIG. 4 embodiment. A second input is received by input 56 of summing device 58, passes through amplifier 60, ADC 62, DSP 18, DAC 64 and LPF 66 in a similar fashion. The system can easily be adapted to phase match numerous AC coupled channels by adding additional summing devices, amplifiers, converters and filters, as is readily apparent to one skilled in the art. An alternative to the FIG. 5 embodiment has several DSPs operating from a common clock source. Each DSP controls a different channel and the common clock allows each channel to be phase matched by the DSP.

The FIG. 5 embodiment allows accurate response control and also allows higher order filters to be implemented with great accuracy. Higher order filters allow AC frequencies below the AC coupling cutoff frequency to be attenuated significantly more than is possible with a first order filter. Furthermore, the response has a reasonably sharp cutoff below the cutoff frequency and reasonably flat frequency response above the cutoff frequency.

It should also be recognized that phase matching among several channels comes from being able to accurately match the phase response of a transfer function for each channel independently. It should be noted, however, that phase matching at high frequencies still depends on reasonably accurate matching of the rest of the parts in the analog signal path.

The preferred ADC is a delta-sigma ADC. This form of ADC eases phase matching among channels at higher frequencies, but it also introduces difficulties in the implementation of the AC coupling feedback through the DSP. Specifically, the ADC can introduce a delay in the signal path. This delay must be accounted for in the design of the net digital filter in the feedback loop. It can be, for example, included in equation (7) referred to above.

The resultant transfer function, however, may contain additional poles that result in a non-flat frequency response throughout the passband of the channel. An additional filter in the DSP can be implemented to cancel the unwanted poles with zeroes. Preferably, finite impulse response filters are used for this purpose.

A significant contribution that the invention makes is the ability to change the cutoff frequency of the AC coupling, through choice of appropriate coefficients used by the algorithms in the DSP. One can envision storing the required set of coefficients for each of a set of cutoff frequencies. This is certainly practical, but a significant enhancement occurs if methods are available to take as input simply an arbitrary desired filter cutoff frequency and from that input, set up appropriate filter coefficients.

To illustrate an example of such a method, assume that a second order response, having two poles, is desired. Assume further that the transfer functions in the z-domain of the preferred embodiment are as follows: the summing circuit is $g1(z)=k1$; the amplifier is $g2(z)=k2$; the ADC is $g3(z)=z^{-31}$; the DAC and filter are $h2(z)=k5$; and the DSP is $h1(z)$. For this example, $h1(z)$ is given by:

$$h1(z) = -K3 \frac{k4(z-1) + k3(z-1)^2}{(z-1)^2} \quad (12)$$

The net transfer function of the circuit can be determined as will be readily apparent to one skilled in the art. It is important to note, however, that because of the high order of the ADC transfer function, $g3(z)$, the closed loop response has a large number of undesired poles, resulting in the aforementioned nonflat frequency response.

First, the roots of the denominator of the net transfer function [that is, the pole positions] are found for various combinations of k4 and k6, where $k6=k1\,k2\,k3\,k5$. A list should be produced of k4 and k6 which result in the correct pole positions for the two desired poles for a variety of frequencies over the desired range of AC coupling cutoff frequencies. This is done, for example, with an iterative numerical technique to adjust a k4, k6 pair to achieve pole positions within a desired tolerance.

For each k4, k6 pair, the two desired poles are removed from a list of all the poles of the net transfer function. The remaining poles are converted to an equivalent polynomial. The coefficients of that polynomial are the coefficients of the FIR correction filter. Those coefficients are added to the list of k4, k6 pairs, or otherwise saved with the associated filter cutoff frequency.

Numerical or other methods are used to find an approximation formula for each of the coefficients, that is, for k4, k6, and each of the FIR filter coefficients. A particular approximation formula which has yielded good results in this case is a polynomial, that is, for example, $$f(x) = ax^3 + bx^2 + cx + d \quad (13)$$

f(x) is to be the approximation to one of the coefficients, and x is the desired AC coupling cutoff frequency, or more properly, the ratio of desired frequency to the system sampling frequency. Higher or lower order polynomials or other approximation functions are possible. For each coefficient (k4, k6, and each FIR filter coefficient), there will be a set of coefficients (a, b, c, d) to be used with equation (13). In this illustration, four coefficients will be required for each of thirty-four equations, resulting in one hundred thirty-six coefficients, which can then be used to set up the filtering in the DSP, both the algorithm required to generate the feedback in the originally-described invention and the FIR correction filtering. This is not particularly efficient if fewer than five different AC coupling cutoff frequencies were to be used, but it is far more efficient than storing a table of coefficients for, say, ten or more different cutoff frequencies.

This approximation method can be carried to one further level of abstraction. If the coefficients of the FIR filter are numbered in sequence, it is found that the coefficients (a, b, c, d) for equation (13) can themselves be generated from approximation formulas. Specifically, a third-order polynomial exactly as (13) except where x is now the FIR filter coefficient number can be used to generate each of the set (a, b, c, d) for equation (13). Thus, to generate all of k4, k6, and the thirty-two FIR filter coefficients, it is possible to use a table of eight coefficients for equation (13) for k4 and k6, and another set of sixteen coefficients to generate the the (a, b, c, d) coefficients for equation (13) for each of the thirty-two FIR filter coefficients. A total of twenty-four coefficients is used to set up the AC coupling feedback and the FIR correction filter for any arbitrary frequency within a prescribed range. The range, for example, can reasonably be from below 0.1 Hz to 100 Hz with a 50 k samples/second sampling rate.

Errors are introduced any time approximations are used, but in this example, the errors can be quite small with appropriate choice of approximation coefficients and algorithm. In addition, even though there are small errors, the same errors will occur in all channels set up with the same algorithms and AC coupling cutoff frequency, so channel-to-channel phase matching is maintained.

From the foregoing, it will be recognized that the various embodiments of the present invention advantageously overcome the cited drawbacks of the prior art, while providing features not heretofore available in prior art AC coupling systems.

For example, no relays are used. Instead, highly reliable current sources and/or resistors are used in the preferred embodiment. Likewise, the FIG. 4 circuit can easily accommodate amplifier gain switching. The signal path gain can be dynamically switched while maintaining the overall feedback loop gain at a constant value, thus preventing introduction of additional transients in the AC coupling loop.

Still further, the uncalibrated response, particularly the phase response, can be known accurately resulting in good interchannel phase match. The circuit can also be used to calibrate itself for even better performance. Finally, the LPF and DAC noise are cancelled by feedback and filtering, except near $\omega_c$. Additionally, noise and distortion can be controlled using digital signal processing techniques.

Having described and illustrated the principles of our invention with reference to preferred embodiments thereof, it will be apparent that these embodiments can be modified in arrangement and detail without departing from the principles of the invention.

For example, while this specification particularly detailed two illustrative summing circuits 12', 12", it will be apparent to those skilled in the art that a variety of other circuits can also be used.

Further, while the invention has been described as utilizing separate ADC, DSP, DAC, and signal processing circuits, some or all of these and/or other circuits can be incorporated into a single circuit. Still further, some circuit elements shown here in hardware form can be implemented as software routines executed on a suitably powered microprocessor and/or DSP as well, and elements indicated as implemented in software routines may alternatively be implemented in hardware.

Still further, while the invention preferably uses a DSP, it will be apparent to those skilled in the art that standard microprocessors or other types of hardware can be used. Examples include gate arrays, field programmable gate arrays, programmable array logic, and any other digital processing hardware which can implement the scaling, adding and delay operations implied by the equations discussed herein.

In view of the wide variety of embodiments to which the principles of our invention can be applied, it should be apparent that the detailed embodiments are illustrative only and should not be taken as limiting the scope of our invention. Rather, we claim as our invention all such modifications as may come within the scope of the following claims and equivalents thereto.

We claim:

1. In a test/measurement instrument including an input terminal for receiving an input signal, the input terminal being serially coupled to signal analysis circuitry, an improvement comprising AC coupling means, including digital processing hardware, interposed between the input terminal and the signal analysis circuitry for providing to the signal analysis circuitry an output signal substantially free of a DC component, said AC coupling means including means for sensing a DC component of said output signal and to control a corresponding subtraction signal in response thereto, said subtraction signal being subtracted from the input signal to yield the output signal, wherein drift in the DC component of the input signal is automatically tracked and cancelled, the AC coupling means having a transfer function, and the digital processing hardware for detecting a first change in the transfer function of the AC coupling means and for synchronously changing the transfer function in response to the first change.

2. The test/measurement instrument of claim 1 wherein the transfer function includes a cutoff frequency and the digital processing hardware is for changing the cutoff frequency.

3. The test/measurement instrument of claim 1 wherein the transfer function is a first transfer function and the digital processing hardware is for changing the first transfer function to a second transfer function.

4. The test/measurement instrument of claim 1 wherein the AC coupling means includes a low pass filter coupled to the digital processing hardware.

5. The test/measurement instrument of claim 1 in which the AC coupling means includes a summing device for combining the input signal with the subtraction signal, said summing device including first and second matched current sources.

6. The test/measurement instrument of claim 1 in which the digital processing hardware includes a digital signal processor.

7. The test/measurement instrument of claim 1 wherein the digital processing hardware is for zeroing the subtraction signal so that the DC component of said output signal is unchanged by the AC coupling means.

8. The test/measurement instrument of claim 1 wherein the input terminal is a first input terminal and the test/measurement instrument includes a second input terminal coupled to the AC coupling means, wherein the AC coupling means is for phase matching signals on the first and second input terminals.

9. An electrical circuit for AC coupling an electrical signal having AC and DC components comprising:

a summing device having a first input for receiving the electrical signal, a second input for receiving a subtraction signal, and an output for delivering an AC coupled electrical signal, the subtraction signal being of a magnitude to subtract the DC component of the electrical signal; and digital processing hardware having an input coupled to the output of the summing device for receiving the AC coupled electrical signal and an output coupled to the second input of the summing device for providing the subtraction signal, the digital hardware being operable to dynamically change the subtraction signal with corresponding changes in the DC component of the electrical signal for producing the AC coupled electrical signal; and an analog-to-digital converter coupled between the output of the summing device and the input to the digital processing hardware and a digital-to-analog converter coupled between the output of the digital processing hardware and second input of the summing device for providing the subtraction signal.

10. The electrical circuit of claim 9 further including a low pass filter coupled between the digital-to-analog converter and the second input of the summing device.

11. The electrical circuit of claim 9 further including an amplifier coupled between the output of the summing device and the analog-to-digital converter.

12. The electrical circuit of claim 9 wherein the digital processing hardware is a digital signal processor that provides for an instantaneous readout of the subtraction signal.

13. The electrical circuit of claim 9 wherein the summing device comprises first and second resistors, the first resistor having an input for receiving the electrical signal and an output coupled to the input of the digital processing hardware for delivering the AC coupled signal, the second resistor having an input coupled to the output of the digital processing hardware for receiving the subtraction signal and an output coupled to the output of the first resistor for combining the electrical signal and the subtraction signal.

14. The electrical circuit of claim 9 wherein the summing device comprises a resistor and first and second current sources, the resistor having an input terminal for receiving the electrical signal and an output terminal coupled to the input of the digital processing hardware for delivering the AC coupled electrical signal, the first current source having a control terminal coupled to the digital processing hardware for receiving the subtraction signal and an output terminal coupled to the input of the resistor, the second current source having control terminal coupled to the output of the digital processing hardware for receiving the subtraction signal and a input terminal coupled to the output of the resistor.

15. The electrical circuit of claim 9 wherein the electrical circuit has a transfer function, and the digital processing hardware is for detecting a first change in the transfer function and synchronously changing the transfer function in response to the first change so that the transfer function of the electrical circuit is substantially unchanged.

16. The electrical circuit of claim 15 wherein the transfer function includes a cutoff frequency and the digital processing hardware is for changing the cutoff frequency.

17. The electrical circuit of claim 15 wherein the transfer function is a first transfer function and the digital processing hardware is for changing the first transfer function to a second transfer function.

* * * * *